(12) United States Patent
Gamble et al.

(10) Patent No.: US 6,551,851 B2
(45) Date of Patent: Apr. 22, 2003

(54) PRODUCTION OF DIAPHRAGMS OVER A CAVITY BY GRINDING TO REDUCE WAFER THICKNESS

(75) Inventors: Harold S Gamble, Dromore (GB); S J Neil Mitchell, Newry (GB); Andrzej Prochaska, Lodz (PL); Stephen Peter Fitzgerald, Crumlin (GB)

(73) Assignee: Randox Laboratories Limited, Antrim (GB)

( * ) Notice: Subject to any disclaimer, the term of this patent is extended or adjusted under 35 U.S.C. 154(b) by 0 days.

(21) Appl. No.: 09/881,744

(22) Filed: Jun. 18, 2001

(65) Prior Publication Data

US 2002/0045287 A1 Apr. 18, 2002

(30) Foreign Application Priority Data

Jun. 23, 2000 (GB) .............................. 0015500

(51) Int. Cl.[7] .............................. H01L 21/304
(52) U.S. Cl. .................. 438/53; 438/456; 438/459
(58) Field of Search .................... 438/53, 455, 456, 438/459; 73/727; 257/419

(56) References Cited

U.S. PATENT DOCUMENTS

| | | | |
|---|---|---|---|
| 4,833,920 A | | 5/1989 | Knecht et al. |
| 5,145,810 A | | 9/1992 | Matsumi |
| 5,242,863 A | * | 9/1993 | Xiang-Zheng et al. ...... 437/228 |
| 5,294,760 A | | 3/1994 | Bower et al. |
| 5,335,550 A | * | 8/1994 | Satou ............................ 73/727 |
| 5,604,144 A | | 2/1997 | Kurtz |
| 5,632,854 A | * | 5/1997 | Mirza et al. ................... 438/53 |
| 5,683,594 A | * | 11/1997 | Hocker et al. ................. 216/33 |
| 5,700,603 A | | 12/1997 | Lee |
| 5,744,725 A | | 4/1998 | Chen et al. |
| 5,814,920 A | * | 9/1998 | Takeuchi et al. ............. 310/330 |
| 6,038,928 A | | 3/2000 | Maluf et al. |
| 6,116,863 A | | 9/2000 | Ahn et al. |

FOREIGN PATENT DOCUMENTS

| EP | 0 755 793 A2 | 1/1997 |
|---|---|---|
| JP | A 3-245576 | 11/1991 |
| JP | 2000 022168 | 1/2000 |

OTHER PUBLICATIONS

Goustouridis et al., "Miniaturization of Si Diaphragms obtained by wafer bonding", Microelectric Engineering vol. 41–42, Mar. 1, 1998, pp. 437–440.

* cited by examiner

*Primary Examiner*—Carl Whitehead, Jr.
*Assistant Examiner*—Stephen W. Smoot

(57) ABSTRACT

A method of manufacturing a diaphragm utilising a precision grinding technique after etching a cavity in a wafer. A technique for preventing distortion of the diaphragm based on use of a sacrificial layer of porous silicon is disclosed.

12 Claims, 5 Drawing Sheets

PRODUCTION OF DIAPHRAGMS OVER A CAVITY BY GRINDING TO REDUCE WAFER THICKNESS

BACKGROUND OF THE INVENTION

This invention relates to micromachined silicon diaphragms and specifically to methods of manufacturing such diaphragms.

The principle of working of many micromechanical devices employs the use of flexible diaphragms as a flexural part, usually acting as a passive transducing element. The wide range of devices incorporating flexible diaphragms includes micromachined pressure sensors, microphones and a variety of microfluidic devices such as micropumps and ink-jet print-heads.

The geometry tolerance of the diaphragm during the fabrication process, as well as its thermal compatibility with the rest of the device can have a great impact on the overall device performance, especially in applications such as low pressure sensing or precise pico-litre volume liquid handling.

Since the beginning of the micromachining era, different solutions have been employed in terms of material and geometry control of the diaphragms. Pressure sensors from their early stage employed thin silicon diaphragms as the sensing element. Diaphragms were formed by simply anisotropically etching exposed silicon areas with the thickness of the diaphragms being controlled either by timed etching or by etch-stop techniques such as heavy boron doping or reverse p-n junction formation.

The flexural element material in ink-jet print-heads and micropumps was usually made of stainless steel, glass or silicon.

An example of a stainless steel diaphragm is shown in "The piezoelectric capillary injector—A new hydrodynamic method for dot pattern generation", E Stemme and S. Larsson, IEEE Transactions on Electron Devices, Vol. ED-20, No. 1, January 1973, pages 14–19.

Examples of glass diaphragms are shown in "Fabrication of an integrated planar silicon ink-jet structure", K. Petersen, IEEE Transactions on Electron Devices, Vol. ED-26, No. 12, December 1979 and "Micromachined flat-walled valveless diffuser pumps", A. Olsson, P. Enoksson, G. Stemme and E. Stemme, Journal of Microelectromechanical Systems, Vol. 6, No. 2, June 1997.

Examples of silicon diaphragms are given in "Design and development of a silicon microfabricated flow-through dispenser for on-line picolitre sample handling", T. Laurell, L. Wallman and J. Nilsson, Journal of Micromechanics and Microengineering 9 (1999), pages 369–376 and "The flow structure inside a microfabricated inkjet printhead", C. Meinhart and H. Zhang, Journal of Microelectromechanical Systems, Vol. 9, No. 1, March 2000, pages 67–75.

The choice of the diaphragm material is dependent on the compatibility with the overall fabrication process and in terms of standard micromachining technology based on batch fabrication two main materials are glass and silicon. The limitations of using glass consist firstly of the difficulty of its precise machining and secondly of its thermal mismatch with the silicon. These limitations disappear in the case of silicon.

In most cases silicon diaphragms are formed using silicon etching accompanied by etch-stop techniques. U.S. Pat. No. 4,872,945 describes a process for manufacturing such a silicon diaphragm where a cavity is selectively etched into one face of a silicon wafer prior to etching the other face in order to control the thickness of the wafer.

U.S. Pat. No. 5,915,168 describes a process for manufacturing a cover for an air bridge structure. However, the structure is formed in such a way that it is not flexible.

A significant disadvantage of using etching to reduce the thickness of a silicon wafer is the length of time taken. As an example, removal of 200 $\mu$m of silicon by anisotropic etching using an aqueous solution of potassium hydroxide (KOH) in standard conditions takes three to four hours. Furthermore, the process is dependent on conditions such as temperature.

SUMMARY OF THE INVENTION

In accordance with one aspect of the present invention, there is provided a method of manufacturing a diaphragm over a cavity, the method comprising reducing the thickness of a wafer by grinding and providing a cavity under the diaphragm.

An advantage of grinding lies in its purely mechanical nature and time efficiency. Removal of 200 $\mu$m of silicon using silicon grinding takes typically five minutes and is independent of temperature, and hence, it is possible to manufacture flexible silicon diaphragms with high precision and at high speed in this way.

The diaphragm may be manufactured over the cavity by reducing the thickness of the wafer by grinding one face and forming a cavity in the opposite face.

Alternatively, the cavity may be provided in a further wafer which is bonded to the one wafer prior to grinding the one wafer.

The cavity may be formed either prior to or subsequent to reducing the thickness of the wafer.

The cavity may be formed in a variety of ways including etching.

The diaphragm may be supported during grinding to prevent distortion of the diaphragm. Typically, this support is provided by a sacrificial layer which is removed after grinding.

In a preferred embodiment, the nascent cavity may be used as the sacrificial layer. In a silicon wafer, this may be achieved by forming porous silicon as the sacrificial layer.

The wafer used may carry only one diaphragm. However, for economic reasons, it is desirable for a plurality of diaphragms to be manufactured on the same wafer.

A drop-on-demand dispenser can be manufactured by manufacturing a diaphragm over a cavity according to the first aspect of the invention and bonding thereto a second wafer having a nozzle communicating with the cavity. A plurality of such devices may be fabricated on the two wafers.

The thickness reduction may be performed prior to the bonding step. However, in order to improve the ease of handling, the bonding step is typically performed prior to the thickness reduction step.

The wafers may be made of a variety of materials including glass but, in a preferred embodiment, they are made of a semiconductor such as silicon.

Depending on the application, various sensor or actuator structures could be formed on the diaphragm. These include, but are not restricted to, pneumatic, thermal, electrostatic, piezoresistive and piezoelectric devices. In the case of a piezoelectric device, this could be glued to the diaphragm.

Preferably, however, top and bottom electrodes and a piezoelectric element are screen printed onto the diaphragm. This screen printing process is advantageously performed prior to removing the sacrificial layer.

BRIEF DESCRIPTION OF THE DRAWINGS

Examples of the present invention will now be described with reference to the accompanying drawings, in which.

DETAILED DESCRIPTION OF THE INVENTION

Figure 1:
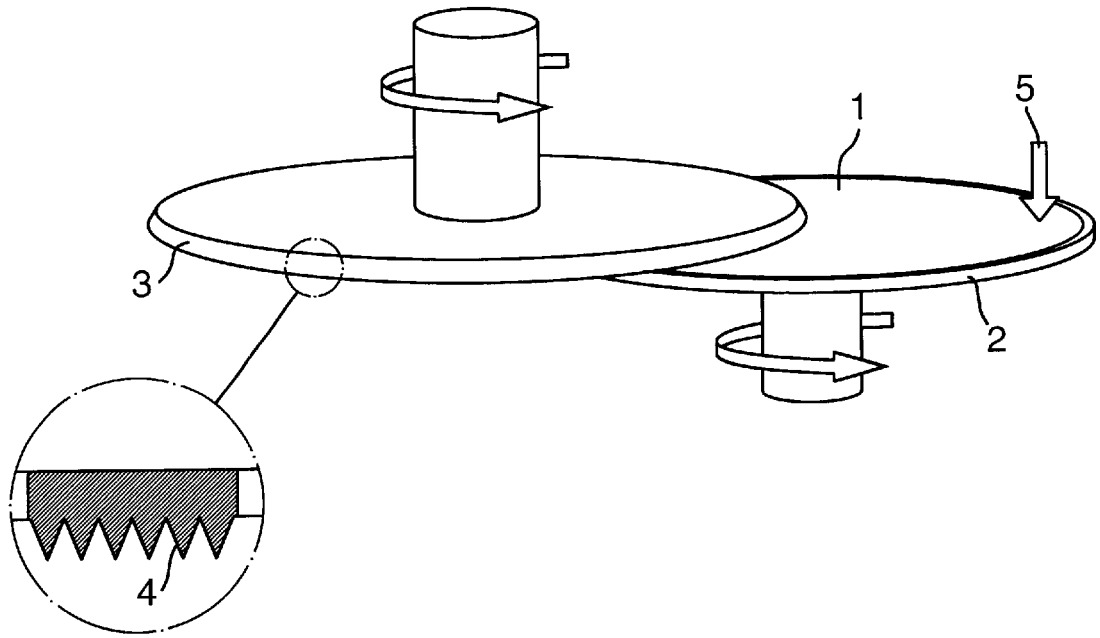
FIG. 1 is a schematic view of apparatus for the precision grinding of silicon wafers.

FIG. 1 shows a silicon wafer 1 held on a wafer holder 2. A grinding wheel 3 and the silicon wafer 1 rotate at high speed. During rotation, the grinding wheel 3 is kept in direct contact with the silicon wafer 1 and exerts a certain pressure on the silicon wafer 1. This causes steady abrasion of the silicon wafer 1 by the diamond teeth 4 of the grinding wheel 3. The amount of material removed from the silicon wafer 1 is controlled by a thickness gauge 5.

This process is purely mechanical and does not depend on parameters such as temperature or wafer doping concentration. Precision grinding of the silicon wafer 1 proceeds in two stages; coarse grinding and fine grinding.

During the coarse grinding stage, the rate of removal of silicon from the silicon wafer 1 is about 250 $\mu$m/min and the wafer thickness tolerance is 25 $\mu$m. During the fine grinding stage, the rate of removal of silicon from the silicon wafer 1 is 20 $\mu$m/min and the wafer thickness tolerance is 0.5 $\mu$m.

Figure 2A:
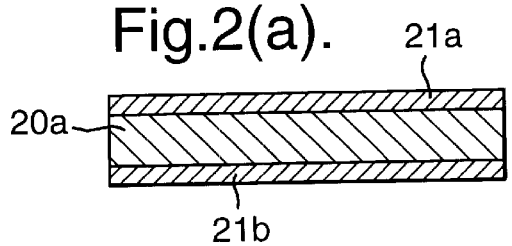
FIGS. 2a to 2j show the process steps involved in producing an all silicon drop-on-demand dispenser.
Figure 2B:
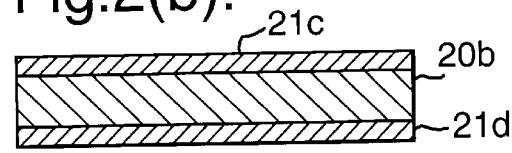
Figure 2C:
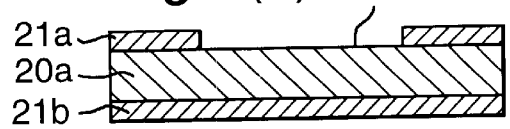
Figure 2D:
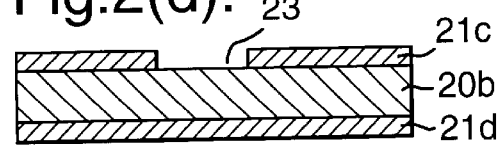
Figure 2E:
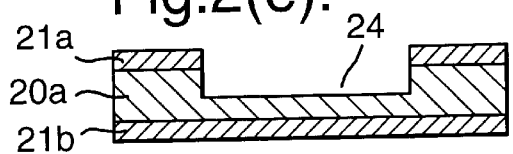
Figure 2F:
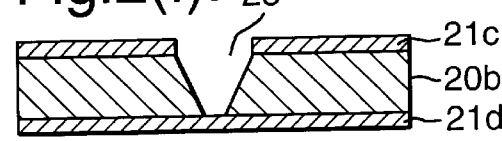
Figure 2G:
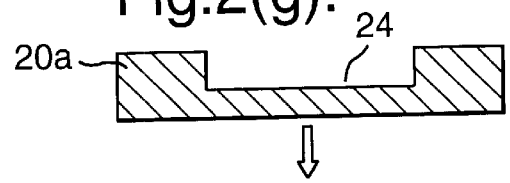
Figure 2H:
Figure 2I:
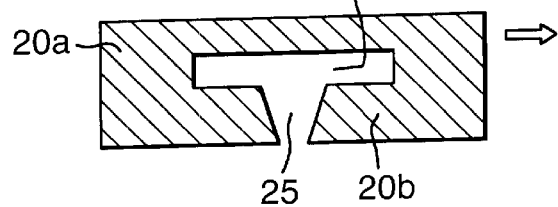
Figure 2J:
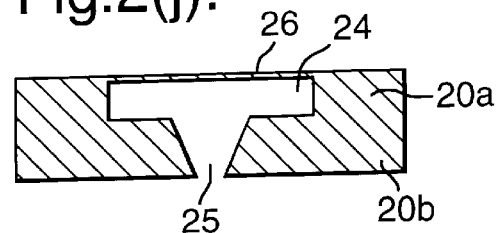

The process steps typically used to manufacture a drop-on-demand dispenser are shown in FIGS. 2a to 2j. The process starts as shown in FIGS. 2a and 2b with deposition of 1000 Å thick silicon nitride layers 21a–21d on front and back faces of two silicon wafers 20a and 20b. Typically, the silicon wafers 20a and 20b may be of 10 cm diameter with n- or p- doping and an initial thickness of 525±25 $\mu$m. Subsequently, the silicon nitride layer 21a on silicon wafer 20a is patterned with circular patterns of typical diameter 6mm and etched using a plasma etching process to provide an etch mask 22 as shown in FIG. 2c. The silicon nitride layer 21c on silicon wafer 20b is patterned with square openings and similarly etched using a plasma etching process to provide etch mask 23 as shown in FIG. 2d. The next step consists of anisotropic etching of silicon wafer 20a to produce cavity 24 as shown in FIG. 2e and of silicon wafer 20b to produce the wafer-through opening 25 as shown in FIG. 2f. The depth of the cavity is typically within the range of 25–75 $\mu$m. The silicon nitride layers 21a to 21d are then stripped from both silicon wafers 20a and 20b as shown in FIGS. 2g and 2h. The silicon wafers 20a and 20b are then bonded as shown in FIG. 2i using a silicon direct bonding process in such a way that the wafer-through opening 25 in silicon wafer 20b is in the centre of cavity 24 in silicon wafer 20a. The subsequent and last stage of the process shown in FIG. 2j consists of precision grinding silicon wafer 20a to control the thickness of the diaphragm 26.

In the case of thick diaphragms, >150 $\mu$m, and/or deep cavities it is possible to use single wafers since after grinding the wafer thickness will still be sufficient to provide mechanical strength and stability. It is thus possible to follow the procedure for silicon wafer 20a shown in FIGS. 2a,c,e,g,i without bonding it to wafer 20b before grinding. Diaphragms of thickness 150 $\mu$m have been manufactured in this way. However, for thin diaphragms <100 $\mu$m, especially when combined with shallow cavities, the use of single substrates would result in a very fragile wafer. In this case, it is preferable to bond the silicon wafer 20a to wafer 20b before grinding. Structures with diaphragm thickness <100 $\mu$m have been achieved in this way.

Figure 3:
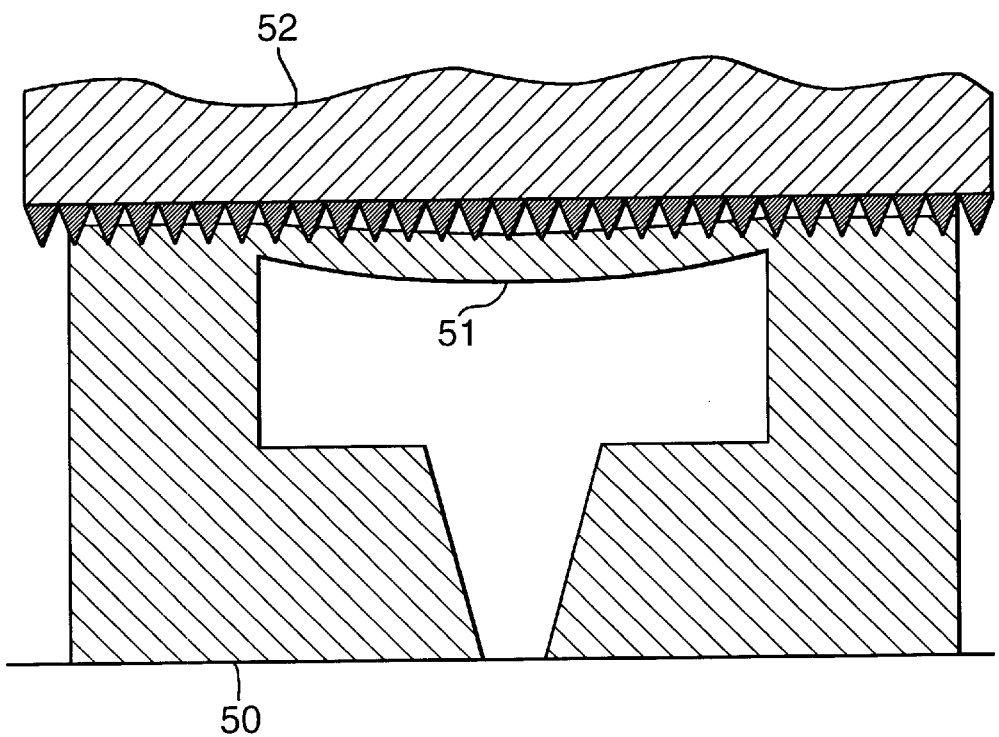
FIG. 3 is a schematic cross-section showing the mechanism by which the diaphragms deflect.

Some deflection of the diaphragm can occur during the process of grinding, by a non-uniform removal of the silicon material in the diaphragm area, because of the diaphragm deflection due to the pressure applied to it by the grinding teeth. This is illustrated in FIG. 3 which shows a silicon wafer 50 with diaphragm 51. The pressure exerted by grinding wheel 52 causes the diaphragm to bend and hence the amount of silicon removed from the silicon wafer 50 is not constant across the diameter of diaphragm 51.

Due to increasing flexibility of the diaphragm towards its centre, and because of the lack of support underneath it during grinding, the diaphragm will deflect, with the highest deflection being at its centre, and the smallest near the edges (see FIG. 3). This, in turn, will cause non-uniform removal of the silicon material from the diaphragm (more material removed near the edges, less near the centre) and, in consequence, will induce the difference between the area of the top and bottom of the diaphragm, resulting in buckling of the diaphragm.

The most straightforward way to prevent diaphragm buckling, is to perform grinding of the wafers, before etching cavities and diaphragm formation. This solution, however, applies only to the cases where total cavity and diaphragm thickness is big enough for single wafers to be handled.

In cases where the diaphragms are thin, and/or it is necessary to perform silicon wafer bonding before grinding (see FIGS. 2i,j), easily removable support must be provided for the diaphragms.

A suitable technique for providing this support involves the formation of porous silicon in the cavities before grinding.

An example fabrication process utilising porous silicon as a support consists of the following steps:

1. Two batches of silicon wafers are dry oxidised to produce an oxide layer with a thickness of typically 60–150Å.
2. Silicon nitride is deposited on both batches of silicon wafers with a typical thickness of 3000–4000Å.
3. The silicon nitride on the front side of the first batch of wafers is patterned for cavity window creation in the same manner as silicon wafer 20a shown in FIG. 2c. The silicon nitride and dry oxide on the back of the first batch of wafers is removed using plasma etching.

4. Porous silicon is formed in the exposed silicon windows on the front of the first batch of wafers.
5. The silicon nitride layer is then removed from the front of the first batch of wafers, typically using orthophosphoric acid.
6. Processing of the second batch of wafers is carried out according to that shown in FIGS. 2b,d,f,h for silicon wafer 20b. When the silicon nitride is removed, the underlying oxide is left.
7. Both batches of wafers are then bonded together using an aligned silicon direct bonding process.
8. Silicon diaphragms are then formed above the porous silicon regions using the precision grinding process.
9. The porous silicon is then removed by chemical etching.

Figure 4A:
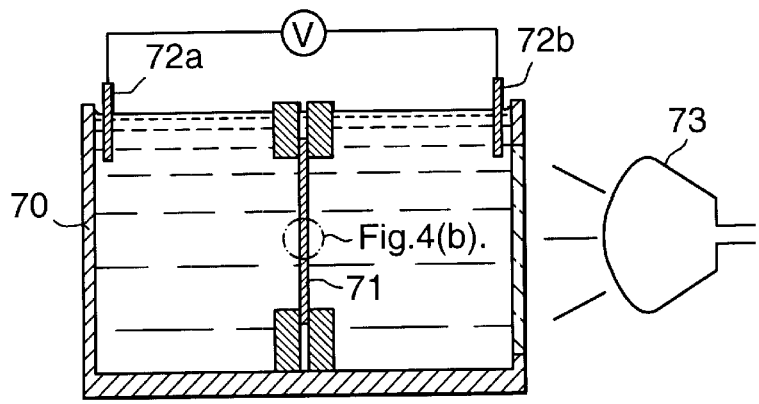
FIGS. 4a,4b show a process for producing porous silicon and a schematic view of a cavity containing porous silicon formed in a silicon wafer.

The porous silicon formation process used in step 4 is shown in FIG. 4a. A jig 70 contains an acid mixture, typically of hydrofluoric acid, ethanol and water in the ratio 1:1:2. The silicon wafer 71 is suspended in this solution along with electrodes 72a and 72b and an electric current caused to flow between them. The applied current density is in the range from 4 to 9 mA/cm$^2$. The silicon wafer 71 is illuminated from the back using a tungsten halogen lamp 73.

Figure 4B:
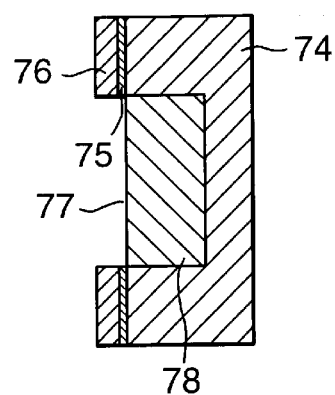

Also shown in FIG. 4b is a large scale view of a silicon wafer 74 with oxide and silicon nitride layers 75 and 76 respectively. The porous silicon 77 forms in the cavity 78. A wide range of porous silicon depths can be formed in this way, depending on current density and process duration.

After porous silicon formation, and before the bonding stage, porous silicon may be removed from some cavities by a short immersion of a part of the wafer in aqueous potassium hydroxide solution (40%wt). This allows, in a further stage, to evaluate, within the same wafer, the effect of porous silicon on diaphragm buckling magnitude.

Figure 9A:
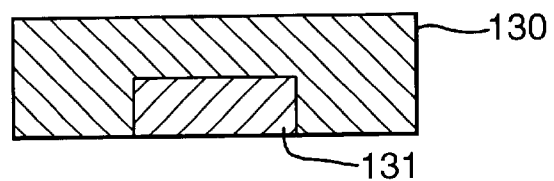
FIGS. 9a to 9c show a diaphragm over a cavity where the cavity is supported by porous silicon during grinding; and, FIG. 10 shows a wafer with a plurality of identical diaphragms.
Figure 9B:
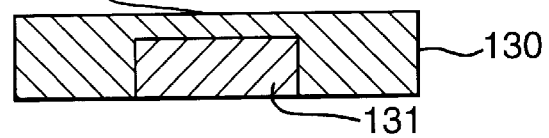
Figure 9C:
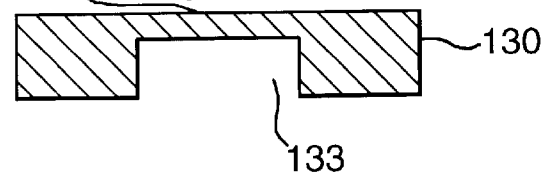

FIG. 9a shows a wafer 130 having a cavity containing porous silicon 131. The wafer 130 is ground to provide a diaphragm 132 as shown in FIG. 9b. The porous silicon 131 supports the diaphragm 132 during the grinding. The porous silicon 131 is then removed to leave a cavity 133 under the diaphragm 132 as shown in FIG. 9c.

Figure 5:
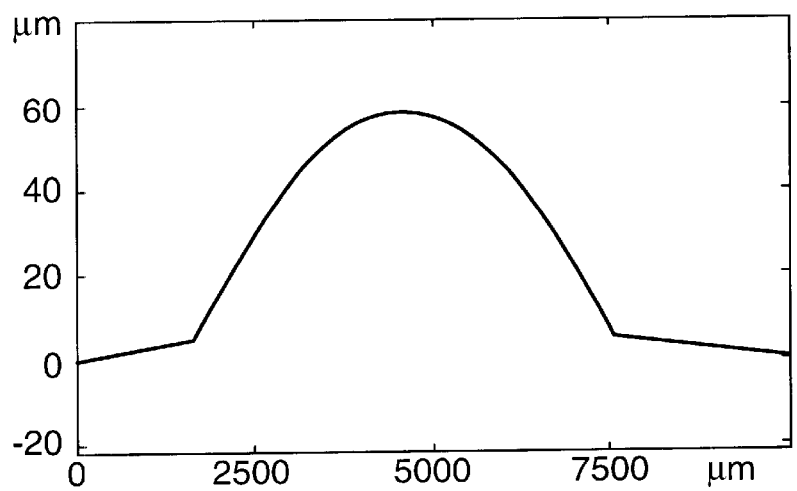
FIG. 5 shows the profile of a diaphragm formed without support.
Figure 6:
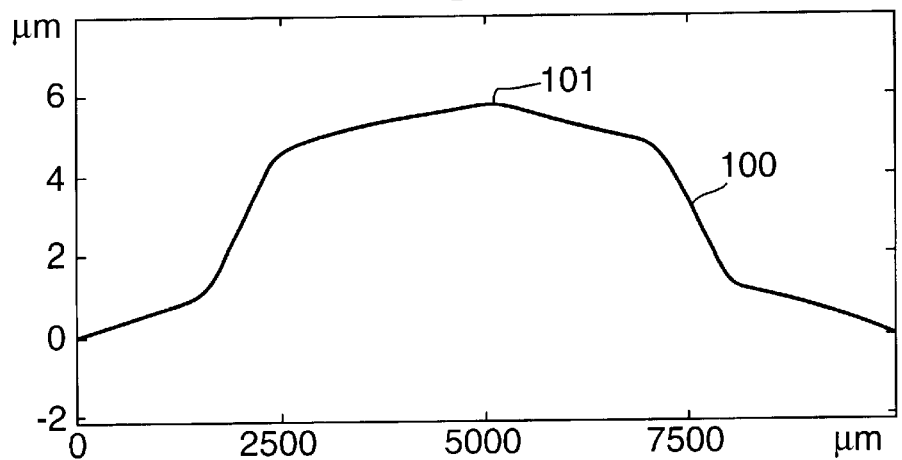
FIG. 6 shows the profile of a diaphragm formed with porous silicon support.

After the grinding stage and before removal of the porous silicon, buckling of the diaphragms was investigated using an Alpha Step 200 measuring equipment from Tencor Instruments. It was observed that the presence of porous silicon, during grinding, strongly suppresses diaphragm distortion. FIGS. 5 and 6 show deflection profiles of two diaphragms of thickness 50 μm. The profile shown in FIG. 5 is of a diaphragm formed without support, while FIG. 6 shows the profile of a diaphragm formed with porous silicon support.

It is clearly seen from these profiles that providing diaphragm support in the form of porous silicon decreases distortion magnitude.

Moreover, it was observed that the profile of the diaphragms formed with porous silicon underneath is almost flat in shape, unlike the diaphragms formed without porous silicon underneath, which have a curved profile.

Some profiles of the diaphragms with porous silicon underneath showed a small tip 101 at the centre of profile 100 as shown in FIG. 6.

The existence of the tip 101 in the centre of the diaphragm may be explained by the fact that, in the centre of the bottom of the cavities, there are openings etched through the bottom wafer. During grinding, there is no support provided for the area of the diaphragm above the opening. Thus, the area of the diaphragm, above the opening, will bend more during grinding than other parts of the diaphragm, and eventually it will lead to higher post-grinding distortion in that area. This is asserted by the fact that, in the samples where the etched-through opening was outside the main cavity area, no tip in the profile was noticed.

The fact that the distortion takes place at all, is attributed to the existence of a gap between the porous silicon surface and the surface of the other bonded wafer, induced by the thin oxide layer on the wafer with porous silicon and/or the possible damage caused to porous silicon before/during grinding. In cases where no oxide layer is present the deflection of the diaphragm is marginal or virtually eliminated.

A drop-on-demand dispenser manufactured according to the process steps shown in FIGS. 2a to 2j may be actuated using a piezoelectric transducer attached to the diaphragm 26.

Figure 7:
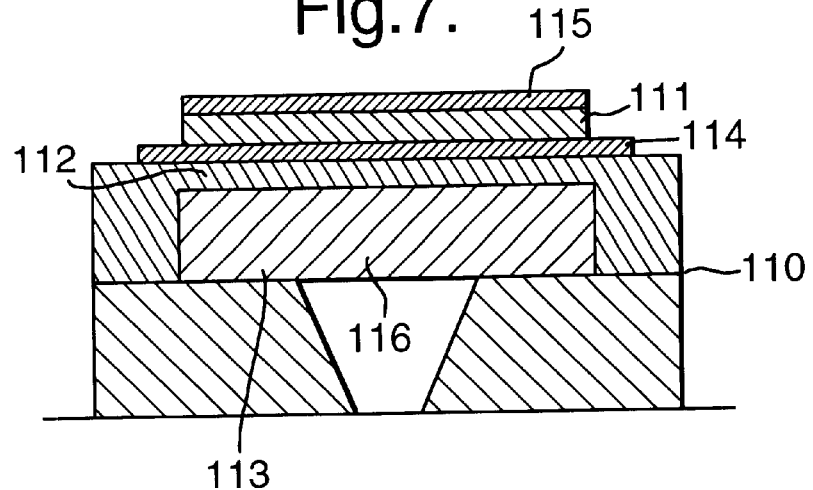
FIG. 7 shows a drop-on-demand dispenser incorporating a piezoelectric transducer.

A drop-on-demand dispenser 110 is shown in FIG. 7 with a piezoelectric transducer 111 on diaphragm 112. A bottom electrode 114 is screen printed on top of diaphragm 112. The piezoelectric transducer 111 is then screen printed onto the bottom electrode 114 using a piezoelectric paste. The bottom electrode 114 occupies a larger area than the piezoelectric transducer 111 to allow for electrical connection. Finally, a top electrode 115 is screen printed onto the piezoelectric transducer 111.

This screen printing process is typically performed prior to removing the porous silicon 116 from the cavity 113 in order to provide support for the cavity during the screen printing process.

The screen printing process may also be performed prior to etching the cavity.

This technique has the advantage that it is not necessary to glue individual piezoelectric discs over each diaphragm and hence, it should provide more stable attachment, and thus, less failures and more device-to-device repeatability. Furthermore, the technique is more appropriate for batch production than gluing individual piezoelectric discs onto the diaphragms.

Figure 8A:
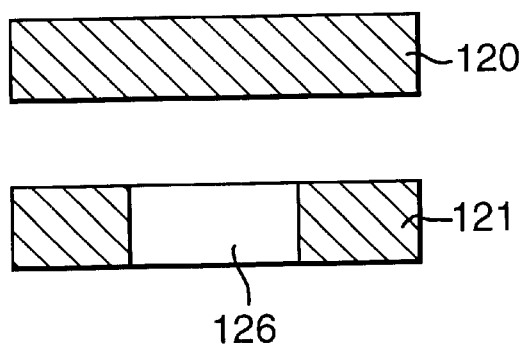
FIGS. 8a to 8c show a diaphragm over a cavity manufactured using two wafers.
Figure 8B:
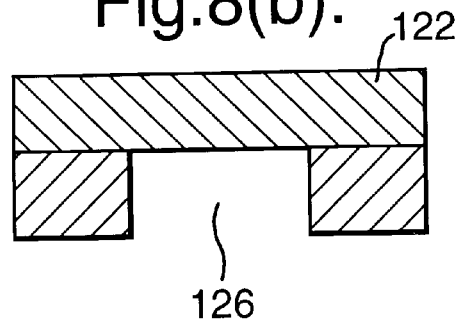
Figure 8C:
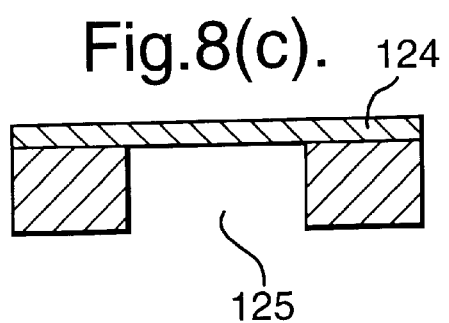

It is possible to manufacture a diaphragm over a cavity using two wafers as shown in FIGS. 8a to 8c. In FIG. 8a, there is a wafer 120 and a wafer 121 having a through etched hole 126. The two wafers 120 and 121 are bonded together as shown in FIG. 8b to provide a bonded wafer pair 122. Subsequently, this wafer pair is ground to provide a diaphragm 124 over a cavity 125 as shown in FIG. 8c.

Figure 10:
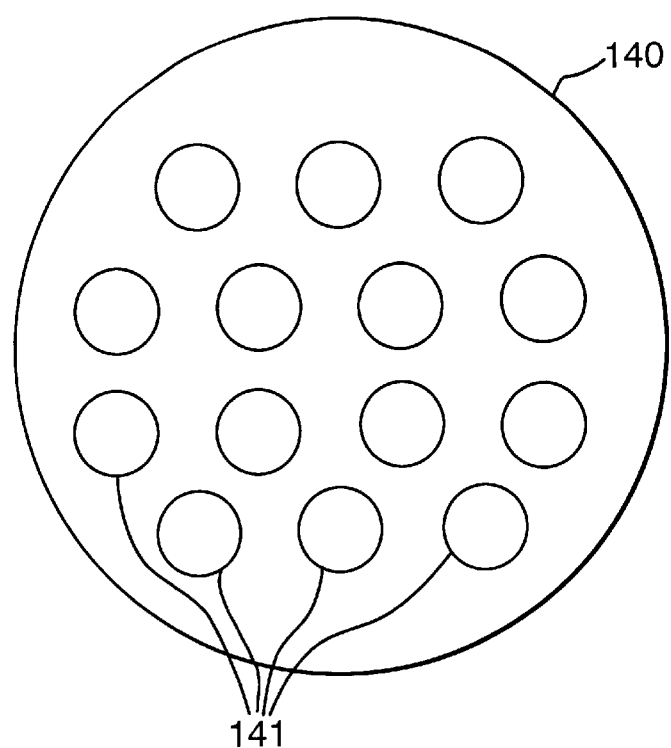

For economic reasons a plurality of identical diaphragms will usually be manufactured on a single wafer. FIG. 10 shows a wafer 140 having fourteen diaphragms 141. The diaphragms 141 may be manufactured according to any of the processes described herein.

We claim:

1. A method of manufacturing a diaphragm over a cavity, the method comprising forming a diaphragm by reducing the thickness of a first wafer by grinding, while said diaphragm is supported by a previously formed sacrificial region of sacrificial material, and removing the sacrificial material to provide a cavity under the diaphragm.

2. A method according to claim 1, wherein the thickness of the first wafer is reduced by grinding one face and the cavity is formed in an opposite face of the first wafer.

3. A method according to claim 1, wherein the first wafer is further supported by a second wafer which is bonded to the first wafer prior to grinding the first wafer.

4. A method according to claim 1, wherein the cavity is formed by etching.

5. A method according to claim 1, further comprising manufacturing a plurality of identical diaphragms on the first wafer.

6. A method according to claim 1, wherein the first wafer comprises silicon and the sacrificial material comprises porous silicon.

7. A method according to claim 6, further comprising manufacturing a plurality of identical diaphragms on the first wafer.

8. A method of manufacturing a drop-on-demand dispenser, the method comprising manufacturing a diaphragm over a cavity by forming a region of sacrificial material in a first wafer, forming a diaphragm by reducing the thickness of said first wafer by grinding while said diaphragm is supported by said sacrificial region and removing the sacrificial material to provide a cavity under the diaphragm; and bonding thereto a second wafer have a nozzle communicating with the cavity.

9. A method according to claim 8, further comprising performing the bonding step prior to the thickness reduction step.

10. A method according to claim 8, wherein said first wafer is made from silicon and the sacrificial material comprises porous silicon.

11. A method according to claim 8, further comprising screen printing top and bottom electrodes and a piezoelectric element onto the diaphragm.

12. A method according to claim 11, further comprising screen printing the top and bottom electrodes and the piezoelectric element prior to removing the sacrificial material.

* * * * *